US011031866B2

(12) United States Patent
Niederberger et al.

(10) Patent No.: US 11,031,866 B2
(45) Date of Patent: Jun. 8, 2021

(54) CHARGE PUMP CIRCUIT AND METHOD FOR VOLTAGE CONVERSION

(71) Applicant: ams International AG, Jona (CH)

(72) Inventors: Mark Niederberger, Eindhoven (NL); Adrian Ryser, Eindhoven (NL); Luca Bettini, Eindhoven (NL)

(73) Assignee: ams International AG, Jona (CH)

( * ) Notice: Subject to any disclaimer, the term of this patent is extended or adjusted under 35 U.S.C. 154(b) by 0 days.

(21) Appl. No.: 17/043,943

(22) PCT Filed: Apr. 15, 2019

(86) PCT No.: PCT/EP2019/059671
§ 371 (c)(1),
(2) Date: Sep. 30, 2020

(87) PCT Pub. No.: WO2019/201854
PCT Pub. Date: Oct. 24, 2019

(65) Prior Publication Data
US 2021/0099079 A1    Apr. 1, 2021

(30) Foreign Application Priority Data
Apr. 16, 2018    (EP) .................................... 18167531

(51) Int. Cl.
*H02M 3/07*    (2006.01)
(52) U.S. Cl.
CPC .................................. *H02M 3/073* (2013.01)
(58) Field of Classification Search
None
See application file for complete search history.

(56) References Cited

U.S. PATENT DOCUMENTS

| 6,486,728 | B2 | 11/2002 | Kleveland | |
| 8,704,587 | B2* | 4/2014 | Ramanan | G11C 5/145 327/536 |
| 10,312,791 | B1* | 6/2019 | Ker | H02M 1/08 |
| 10,680,517 | B1* | 6/2020 | Qiao | G11C 16/30 |
| 2007/0285149 | A1 | 12/2007 | Nakatani | |
| 2014/0270262 | A1 | 9/2014 | Zeleznik et al. | |
| 2014/0307499 | A1* | 10/2014 | Hamamoto | G11C 16/12 365/148 |

FOREIGN PATENT DOCUMENTS

| EP | 3355459 | 8/2018 |
| EP | 3477837 | 5/2019 |

OTHER PUBLICATIONS

Alameh, et al.: "A reconfigurable charge pump in 0.13um CMOS for agile MEMS actuation" Proc. IEEE ICECS 2014, pp. 670-673.
(Continued)

*Primary Examiner* — Thomas J. Hiltunen
(74) *Attorney, Agent, or Firm* — MH2 Technology Law Group LLP (57) ABSTRACT

A charge pump circuit comprises a series circuit of a number N of stage circuits. A stage circuit comprises a converter circuit, a stage output, a stage input coupled via the converter circuit to the stage output, a first clock input and a second clock input coupled to the converter circuit, a control input and an activation transistor having a control terminal coupled to the control input and a first terminal coupled to the stage output.

16 Claims, 5 Drawing Sheets

(56) References Cited

OTHER PUBLICATIONS

European Patent Office, International Search Report for PCT/EP2019/059671 dated Jun. 27, 2019.
Kailuke, A. et al.: "Design and Implementation of low power Dickson Charge Pump in 0.18um CMOS Process" International Journal of Scientific & Engineering Research, vol. 4, Issue 8, Aug. 2013, ISSN 2229-5518, pp. 1941-1944.
Palumbo G. et al.: "Charge Pump Circuits: An Overview on Design Strategies and Topologies" IEEE Circuits and Systems Magazine, IEEE Service Center, New York, NY, US, vol. 10, No. 1, Mar. 15, 2010 (Mar. 15, 2010), pp. 31-45, XP011304720, ISSN: 1531-636X.

\* cited by examiner

CHARGE PUMP CIRCUIT AND METHOD FOR VOLTAGE CONVERSION

BACKGROUND OF THE INVENTION

The present disclosure is related to a charge pump circuit and to a method for voltage conversion.

A charge pump circuit typically generates a pump output voltage that is higher than a supply voltage. A charge pump circuit may be a building block of an integrated circuit. The pump output voltage may be provided e.g. to a micro-electro-mechanical system or to a solid-state memory. In some applications different values of the pump output voltage are required.

SUMMARY OF THE INVENTION

This disclosure provides a charge pump circuit and a method for voltage conversion that is able to generate different values of a pump output voltage.

The definitions as described above also apply to the following description unless otherwise stated.

In an embodiment, a charge pump circuit comprises a series circuit of a number N of stage circuits. A stage circuit comprises a converter circuit, a stage output, a stage input coupled via the converter circuit to the stage output, a first and a second clock input coupled to the converter circuit, a control input and an activation transistor having a control terminal coupled to the control input and a first terminal coupled to the stage output.

Advantageously, the activation transistor is set in a conducting state or in a non-conducting state by a control signal provided to the control input of the stage circuit. Thus, the activation transistor being in a conducting state can set a voltage at the stage output of the stage circuit and thus at the stage input of the following stage circuit. Advantageously, by setting the converter circuits of several of the number N of stage circuits in a deactivated state and the converter circuits of other of the number N of stage circuits in an active state, a pump output voltage provided at a pump output can be determined. The pump output is coupled to the stage output of the last stage circuit of the number N of stage circuits.

In an embodiment, each stage circuit of the number N of stage circuits is realized such as the stage circuit.

In an embodiment, the stage input of a first stage circuit of the number N of stage circuits is coupled or connected to a pump input. The stage circuit may be named first stage circuit. The stage output of the first stage circuit is connected to a stage input of a second stage circuit of the number N of stage circuits and so on.

In an embodiment, the stage output of a last stage circuit of the number N of stage circuits is coupled or connected to a pump output. The last stage circuit may be named Nth stage circuit. The number N of stage circuits form a series connection that is arranged between the pump input and the pump output.

Optionally, the number N may be one, two, three, four or more than four.

In an embodiment, the stage circuit comprises a control buffer having an input coupled to the control input for receiving the control signal. An output of the control buffer is coupled to a second terminal of the activation transistor.

In an embodiment, the control buffer is connected to a first voltage source for receiving a first reference voltage and to a reference potential terminal. Thus, the control buffer is powered by the first reference voltage.

In an embodiment, the charge pump circuit comprises a reference potential terminal for receiving the reference potential.

The reference potential is tapped at the reference potential terminal.

In an embodiment, the control buffer is realized as a control inverter. The control inverter may be arranged between the first voltage source and the reference potential terminal.

The first reference voltage drops across the control inverter.

In an embodiment, in the case that the converter circuit is set in an activated state, the activation transistor of said converter circuit is set in a non-conducting state. In the case that the converter circuit is set in a deactivated state, the activation transistor of said converter circuit is set in a conducting state and the control buffer of said converter circuit generates an output signal that obtains the reference potential and is provided to the stage output via the activation transistor of said converter circuit.

In an embodiment, the stage circuit comprises a first and a second clock buffer. The first clock buffer couples the first clock input to the converter circuit. The second clock buffer couples the second clock input to the converter circuit.

In an embodiment, the first and the second clock buffer are connected to a reference potential terminal and comprise a buffer control terminal for receiving a buffer control signal.

In an embodiment, a stage circuit is activated by activating the converter circuit of the stage circuit. A stage circuit is deactivated by deactivating the converter circuit of the stage circuit. An activated converter circuit typically provides an output voltage at the stage output being higher than an input voltage at the stage input.

In an embodiment, the buffer control signal has a value of a reference voltage in case the stage circuit is activated and a ground potential in case the stage circuit is deactivated.

Thus, the buffer control signal has the value of the reference voltage in case the converter circuit is activated and the ground potential in case the converter circuit is deactivated.

In an embodiment, the charge pump circuit comprises a bandgap circuit providing a reference voltage with the reference voltage value. An output of the bandgap circuit is coupled to the buffer control terminal. The buffer control signal is a function of the reference voltage and the information whether the converter circuit is to be set active or inactive.

In an embodiment, the charge pump circuit comprises a control circuit that provides the control signal to the control input of the stage circuit with a first value in case the stage circuit is activated and a second value in case the stage circuit is deactivated. Thus, the control circuit provides the control signal to the control input of the stage circuit with the first value in case the converter circuit is activated and the second value in case the converter circuit is deactivated.

In an embodiment, the control circuit receives a stage control signal and sets a number L of stage circuits in an activated state as a function of the stage control signal. The number L is equal or smaller than the number N.

In an embodiment, the control circuit provides the buffer control signal to the buffer control terminal. Thus, the output of the bandgap circuit is coupled to the control circuit.

In an embodiment, the converter circuit comprises a first and a second capacitor and a first and a second transistor. The first clock input is coupled to a first electrode of the first capacitor. The stage input is coupled via the first transistor to a second electrode of the first capacitor. The second electrode of the first capacitor is coupled via the second transistor to the stage output. The second clock input is coupled to a first electrode of the second capacitor. A second electrode of the second capacitor is coupled to the stage output.

In an embodiment, the converter circuit comprises a third and a fourth transistor. The stage input is coupled via the third transistor to the second electrode of the second capacitor.

The second electrode of the second capacitor is coupled via the fourth transistor to the stage output.

In an embodiment, the charge pump circuit comprises a number M of permanent stage circuits which couple the stage output of the last of the number N of stage circuits to the pump output of the charge pump circuit. A permanent stage circuit comprises a converter circuit, a stage output, a stage input coupled via the converter circuit to the stage output and a first and a second clock input coupled to the converter circuit. The converter circuit of the permanent stage circuit may be realized such as the converter circuit of the stage circuit.

In an embodiment, a method for voltage conversion comprises setting at least one stage circuit of a series of a number N of stage circuits in an activated state by providing a control signal to a control terminal of an activation transistor with a first value. A stage circuit comprises a converter circuit, a stage output, a stage input coupled via the converter circuit to the stage output, a first and a second clock input coupled to the converter circuit, a control input and the activation transistor with the control terminal being coupled to the control input and with a first terminal coupled to the stage output.

In an embodiment, at least a further stage circuit of the number N of stage circuits is set in a deactivated state by providing a control signal to a control terminal of an activation transistor of the at least a further stage circuit with a second value. Then at least a further stage circuit is implemented such as the stage circuit.

In an embodiment, a pump output voltage is generated at a pump output. The pump output is coupled to the stage output of the last stage of the series of the number N of stage circuits. The pump output voltage is a programmable and/or controllable voltage. The pump output voltage is higher than a supply voltage. The supply voltage powers the charge pump circuit. The pump output voltage is set depending on a stage control signal.

The method for voltage conversion may be implemented e.g. by the charge pump circuit according to one of the embodiments defined above. The method for voltage conversion may be realized as method for operating the charge pump circuit.

In an embodiment, the charge pump circuit is realized as a programmable charge pump. The charge pump circuit may be abbreviated charge pump, charge-pump or QP. With the current mainstream trend of reducing the supply voltage with the adoption of more and more advanced technology nodes, charge-pumps represent a key building block of modern integrated circuits (abbreviated ICs) and they are expected to maintain a key role in the future as well. QPs are used to generate a voltage higher than the supply. Such high voltage is required in a variety of applications ranging from micro-electro-mechanical systems, shorted MEMS, to non-volatile memories and others.

In an embodiment, in memory applications, the voltage levels necessary to perform a write/program operation are in the range of a few Volts. Therefore, a charge pump with a few stages may be normally appropriate to reach the desired voltage level. In MEMS applications, the voltage levels required to ensure proper operation of the electro-mechanical transducer are in the order of several tens of Volts, leading to charge-pump circuits made of several tens of stages connected in series. Since the precision of the pump output voltage level is related to the number of stages, the more the stages, the more the inaccuracy of the generated voltage.

For such reason, a programmable charge-pump is advantageous in those applications, such as MEMS interface circuits, where the pump output voltage has to be precisely controlled or the MEMS device to device variation requires an individual bias voltage which can vary in a wide range.

In an embodiment, the charge pump circuit generates a pump output voltage with a voltage level higher than the supply voltage in a programmable manner that can be controlled digitally.

BRIEF DESCRIPTION OF THE DRAWINGS

The following description of figures of embodiments may further illustrate and explain aspects of the charge pump circuit and the method for voltage conversion. Devices and circuit parts with the same structure and the same effect, respectively, appear with equivalent reference symbols. In so far as devices or circuit parts correspond to one another in terms of their function in different figures, the description thereof is not repeated for each of the following figures.

DETAILED DESCRIPTION

Figure 1A:
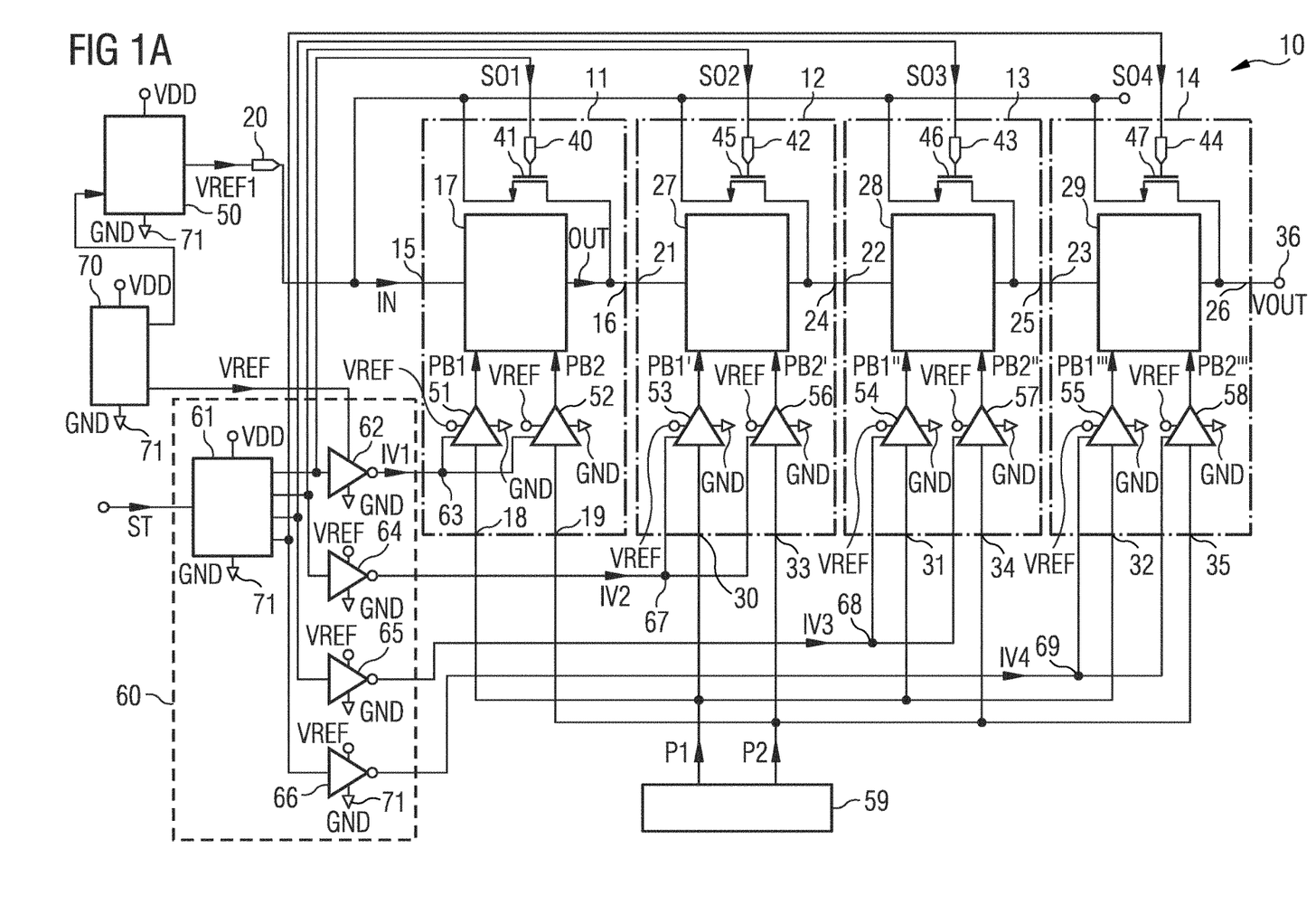
FIGS. 1A to 1C show examples of an embodiment of a charge pump circuit.

FIG. 1A shows an example of an embodiment of a charge pump circuit 10 comprising a number N of stage circuits 11 to 14. The charge pump circuit 10 as shown in the schematic diagram of FIG. 1A is implemented as a programmable charge-pump. The number N of stage circuits 11 to 14 are connected in series. The number N of stage circuits 11 to 14 are realized as a series circuit. A stage circuit 11 which can also be called "first stage circuit" comprises a stage input 15, a stage output 16, a converter circuit 17 and a first and a second clock input 18, 19. The converter circuit 17 couples the stage input 15 to the stage output 16. The first and the second clock input 18, 19 are coupled to two inputs of the converter circuit 17. The charge pump circuit 10 comprises a pump input 20. The stage input 15 of the stage circuit 11 is coupled to the pump input 20. Optionally, the stage input 15 of the first stage circuit 11 is directly connected to the pump input 20. Moreover, the charge pump circuit 10 comprises a pump output 36. A stage circuit can be shorted as stage.

A second, a third and a fourth stage circuit 12 to 14 of the number N of stage circuits are realized such as the stage circuit 11. Thus, the second to the fourth stage circuit 12 to 14 comprise a second to a fourth stage input 21 to 23, a second to a fourth stage output 24 to 26, a second to a fourth converter circuit 27 to 29, further first clock inputs 30 to 32 and further second clock inputs 33 to 35. For example, the second converter circuit 27 couples the second stage input 21 to the second stage output 24. A stage output of a stage circuit is connected to a stage input of the following stage circuit. Thus, the stage output 16 of the first stage circuit 11 is connected to the second stage input 21 of the second stage circuit 12.

According to FIG. 1A, the number N is 4. However the number N may also be 1, 2, 3 or higher than 4. According to FIG. 1A, the fourth stage circuit 14 is the last stage circuit of the number N of stage circuits. Thus, the stage output 26 of the last stage circuit 14, which is the fourth stage output 26 of the fourth last stage circuit 14, is coupled to the pump output 36. The stage output 26 of the last stage circuit 14 may be directly connected to the pump output 36.

Additionally, the stage circuit 11 comprises a control input 40 and an activation transistor 41. The control input 40 is coupled to a control terminal of the activation transistor 41. The control terminal of the activation transistor 41 may be connected to the control input 40. A first terminal of the activation transistor 41 is coupled to the stage output 16. The first terminal of the activation transistor 41 may be connected to the stage output 16.

Correspondingly, the other stage circuits such as the second to the fourth stage circuits 12 to 14 comprise the second to the fourth control inputs 42 to 44 and second to fourth activation transistors 45 to 47. First terminals of the second to the fourth activation transistors 45 to 47 are coupled or connected to the second to the fourth stage outputs 24 to 26 of the second to the fourth stage circuits 12 to 14. The second to the fourth control inputs 42 to 44 are coupled or connected to control terminals of the second to the fourth activation transistors 45 to 47.

The pump input 20 is coupled to a second terminal of the activation transistor 41. The pump input 20 may be connected to the second terminal of the activation transistor 41. Correspondingly, the pump input 20 is coupled or connected to the second terminals of the second to the fourth activation transistors 45 to 47. The charge pump circuit 10 comprises a first voltage source 50 that is connected to the pump input 20.

Additionally, the stage circuit 11 comprises a first and a second clock buffer 51, 52 coupling the first and the second clock input 18, 19 to the converter circuit 17. The first and the second clock buffer 51, 52 are connected to a buffer control terminal 63. Thus, the first and the second clock buffer 51, 52 are arranged between the buffer control terminal 63 and a reference potential terminal 71. The first and the second clock buffer 51, 52 can be enabled or disabled depending on the logic stage on the buffer control terminal 63. The supply voltage of the first and the second clock buffer 51, 52 can be the same as the reference voltage VREF, the first reference voltage VREF1 or the charge pump input voltage IN of the converter circuit 17.

Correspondingly, the second to the fourth stage circuit 12 to 14 comprise further first clock buffers 53 to 55 coupling the further first clock inputs 30 to 32 to the converter circuits 27 to 29. Moreover, the second to the fourth stage circuit 12 to 14 comprise further second clock buffers 56 to 58 coupling the further second clock inputs 33 to 35 to the second to the fourth converter circuits 27 to 29. The further first and the further second clock buffer 53, 56 can be enabled or disabled depending on the logic stage on a second buffer control terminal 67 that provides a second buffer control signal IV2.

The supply voltage of the further first and second clock buffers 53, 56 can be the same as the reference voltage VREF, the first reference voltage VREF1 or the charge pump input voltage IN of the converter circuit 17. The further first and the further second clock buffer 54, 57 are connected to a third buffer control terminal 68 providing a third buffer control signal IV3.

The further first and the further second clock buffer 55, 58 can be enabled or disabled depending on the logic stage on a fourth buffer control terminal 69 providing a fourth buffer control signal IV4. The supply voltage of the further first and the further second clock buffers 55, 58 can be the same as the reference voltage VREF, the first reference voltage VREF1 or the charge pump input voltage IN of the converter circuit 17. Thus, the buffer control terminals 63, 67 to 69 of the different stage circuits 11 to 14 are separated. The buffer control terminals 63, 67 to 69 may optionally be realized as enable terminals or as supply terminals of the clock buffers 51 to 58.

The charge pump circuit 10 comprises a clock generator 59 having a first output coupled to the input of the first clock buffer 51 and to inputs of the further first clock buffers 53 to 55. A second output of the clock generator 59 is connected to the input of the second clock buffer 52 and to inputs of the further second clock buffers 56 to 58.

Furthermore, the charge pump circuit 10 comprises a control circuit 60 having an output coupled to the control input 40 of the stage circuit 11. The control circuit 60 comprises further outputs coupled to the second to the fourth control inputs 42 to 44 of the second to the fourth stage circuits 12 to 14. The control circuit 60 comprises a decoder 61 that is coupled on its output side to the outputs of the control circuit 60. The decoder 61 may be realized as binary-to-thermometer decoder.

Additionally, the control circuit 60 comprises an inverter 62. The inverter 62 couples the output of the decoder 61 to the buffer control terminal 63 of the first and the second clock buffer 51, 52 of the stage circuit 11. The control circuit 60 comprises a second to a fourth inverter 64 to 66 coupling the outputs of the decoder 61 to the second to the fourth buffer control terminals 67 to 69 of the further first and further second clock buffers 53 to 58 of the second to the fourth stage circuit 12 to 14.

Moreover, the charge pump circuit 10 comprises a bandgap circuit 70. An output of the bandgap 70 is connected to a supply terminal of the inverters 62, 64 to 66. Thus, the four inverters 62, 64 to 66 are arranged between the output of the bandgap circuit 70 and the reference potential terminal 71. Moreover, the bandgap circuit 70 may be connected on its output side to the first voltage source 50. Thus, the bandgap circuit may be coupled on its output side to the pump input 20.

A reference voltage VREF is supplied to supply terminals of the inverters 62, 64 to 66. The reference voltage VREF is supplied to supply terminals of the first clock buffers 51, 53 to 55 as well as the second clock buffers 52, 56 to 58. The first clock buffers 51, 53 to 55 and the second clock buffers 52, 56 to 58 may be realized as inverters or inverting circuits.

The reference voltage VREF is generated by the band gap circuit 70. The reference voltage VREF may be applied to the first voltage source 50. The first voltage source 50 generates a first reference voltage VREF1. The first reference voltage VREF1 may be a variable voltage. The first reference voltage VREF1 may be out of the interval:

$$0 \text{ Volt} < VREF1 < VDD$$

A pump output voltage VOUT is generated at the pump output 36. The first reference voltage VREF1 is provided to the pump input 20. The first reference voltage VREF1 is applied to the first terminal of the activation transistor 41. The first reference voltage VREF1 is applied to the first terminal of the second to the fourth activation transistors 45 to 47.

The stage circuit 11 and thus the converter circuit 17 receives an input voltage IN at the stage input 15 and generates an output voltage OUT at the stage output 16 by the operation of the converter circuit 17. The converter circuit 17 generates the output voltage OUT as a function of the input voltage IN.

A first clock signal P1 is provided to the first clock input 18 by the clock generator 59. Moreover, the first clock signal P1 is also provided to the further first clock inputs 30 to 32. Correspondingly, a second clock signal P2 is provided to the second clock input 19 by the clock generator 59. The second clock signal P2 is additionally provided to the further second clock inputs 33 to 35.

The control circuit 60 receives a stage control signal ST. The stage control signal ST may comprise an information about the number L of stage circuits 11 to 14 that are to be set in an activated state. The number L is equal or smaller than the number N. The stage control signal ST is provided to the decoder 61. The decoder 61 generates a control signal SO1 that is provided to the control input 46 and thus to the control terminal of the activation transistor 41.

Correspondingly, the decoder 61 generates a second to a fourth control signal SO2 to SO4 that are provided to the second to the fourth control inputs 42 to 44 and thus to the control terminals of the second to the fourth activation transistors 45 to 47.

In the case that the converter circuit 17 is to be set in an activated state, the activation transistor 41 is set in a non-conducting state. In this case also the second to the fourth converter circuits 27 to 29 are set in an activated state by setting the second to the fourth activation transistors 45 to 47 in non-conducting state by the second to the fourth control signal SO2 to SO4.

However, in another phase of operation, the stage control signal ST may be generated such that the decoder 61 sets one converter circuit or more than one converter circuit in a deactivated state. The deactivated state can be named non-activated state. The control signals SO1 to SO4 are generated such that converter circuits that are close to the pump input 20 are set in a deactivated state and converter circuits that are close to the pump output 36 are set in a deactivated state. Thus, if exactly one converter circuit has to be set in a deactivated state, the converter circuit 17 of the stage circuit 11 is set in a deactivated state. In any case, converter circuits with a lower number are set in a deactivated state before converter circuits with a higher number are set in a deactivated state.

If the converter circuit 17 is to be set in a deactivated state, the activation transistor 41 is set in a conducting state. Thus, the first reference voltage VREF1 is provided from the first voltage source 50 via the activation transistor 41 to the stage output 16 of the stage circuit 11. Correspondingly, if another converter circuit has to be set in a deactivated state, the activation transistor of this stage circuit is set in a conducting state and provides the first reference voltage VREF1 to the stage output of the stage circuit. The activation transistor of any stage circuit between the pump input 20 and the last stage that has to be deactivated may also be set in a conducting state.

The activation transistor 41 is designed as a switch or a by-pass switch. The activation transistor 41 is realized as a field-effect transistor. The activation transistor 41 may be implemented as a metal-oxide-semiconductor field-effect transistor. The activation transistor 41 may be designed as an n-channel metal-oxide-semiconductor field-effect transistor, abbreviated NMOS FET or NMOS switch.

Thus, the control signal SO1 is set at a low voltage value such as a reference potential GND for setting the activation transistor 41 in a non-conducting state. Correspondingly, the control signal SO1 obtains a voltage value higher than a threshold value of the activation transistor 41 in the case that the activation transistor 41 is set in a conducting state.

The control circuit 60 also supplies a buffer control signal IV1 that is inverted with respect to the control signal SO1. The buffer control signal IV1 is provided to the buffer control terminal 63. Thus, in the case that the converter circuit 17 is in an activated state, the buffer control signal IV1 obtains the reference voltage value VREF and drives the first and the second clock buffer 51, 52. Thus, the first and the second clock buffer 51, 52 provide a first and a second buffered clock signal PB1, PB2 to the converter circuit 17. The first and the second buffered clock signal PB1, PB2 have pulses with the value of the reference voltage VREF. The first and the second buffered clock signal PB1, PB2 obtain the reference potential GND between two pulses.

However, in the case that the converter circuit 17 is in a deactivated state, the buffer control signal IV1 obtains the reference potential GND. Thus, the first and the second clock buffer 51, 52 continuously provide the first and the second buffered clock signal PB1, PB2 with the reference potential GND which is static or any other static voltage level or have an open state on their outputs (buffer disabled).

Therefore, the first and the second buffered clock signal PB1, PB2 either obtain the value of the reference potential GND or any other static voltage level or the value of the reference voltage VREF. Advantageously, the converter circuit 17 only receives non-zero buffered clock signals PB1, PB2 in the case that the converter circuit 17 is activated. Thus, energy losses inside the converter circuit 17 are avoided, when the converter circuit 17 is deactivated.

The control circuit 60 also supplies the second to the fourth buffer control signal IV2 to IV4 that are inverted with respect to the second to the fourth control signal SO2 to SO4. The buffer control signals IV1 to IV4 are generated by the inverters 62, 64 to 66 and provided to the buffer control terminals 63, 67 to 69.

In an application like a MEMS microphone, the charge-pump 10 may be configured to deliver a bias voltage for the MEMS microphone. This MEMS bias voltage can reach up to 50 Volt or even higher. The static current drawn on the charge-pump output 36 is only due to leakage currents of the MEMS device, MEMS microphone or application specific integrated circuit, shorted ASIC.

In an embodiment, the clock buffers 51 to 58 driving the buffered clock signals PB1 and PB2 are supplied by the reference voltage VREF. The input voltage IN is connected to the activation transistors 41, 45 to 47 and the stage input 15 of the stage circuit 11. In the general case, the reference voltage VREF of the clock buffers 51 to 58 and the input voltage IN have basically different voltage levels. E.g. the clock buffers 51 to 58 can be supplied by the reference voltage VREF but the activation transistors 41, 45 to 47 and the stage input 15 of the first stage circuit 11 are connected to another reference voltage, namely the first reference voltage VREF1. The first reference voltage VREF1 can have a voltage level e.g. between 0 Volt and a supply voltage VDD. In a first order view, the charge-pump 10 can be considered as unloaded. For the unloaded charge-pump 10, the pump output voltage VOUT can be calculated as:

$$VOUT = \eta \cdot (VREF1 + L \cdot VREF),$$

wherein L is the number of activated stage circuits 11 to 14, $\eta$ is the efficiency of a stage circuit, VREF is the value of the reference voltage and VREF1 is the value of the first reference voltage. The reference voltage VREF supplies the clock buffers 51 to 58. The first reference voltage VREF1 is applied to the stage input of the first active stage. Advantageously, the pump output voltage VOUT can even be varied in smaller steps than VREF.

As shown in FIG. 1A, the first and the second clock buffer 51, 52 have an input to receive the first or the second clock signal P1, P2, are connected to the buffer control terminal 63 for receiving the buffer control signal IV1 and to the reference potential terminal 71 for receiving the reference potential GND. The first clock buffer 51 has an input to receive the first clock signal P1 via the first clock input 18 by the clock generator 59. The second clock buffer 52 has an input to receive the second clock signal P2 via the second clock input 19 by the clock generator 59. The first and the second clock buffer 51, 52 have a supply terminal for receiving the reference voltage VREF for the power supply of the first and the second clock buffer 51, 52. The first and the second clock buffer 51, 52 may be a tri-state buffer. The states are set by the buffer control signal IV1. The first and the second clock buffer 51, 52 may be realized with an inverting function. The further clock buffers 53 to 58 are realized such as the first and the second clock buffer 51, 52.

In an alternative embodiment, the reference voltage VREF is applied to the pump input 20 and thus to the stage input 15 of the stage circuit 11. The reference voltage VREF is also supplied to the first terminals of the activation transistors 41, 45 to 47. The output of the band gap circuit 70 is directly connected to the pump input 20. The first voltage source 50 is omitted. In a first order view, the charge-pump 10 can be considered as unloaded. For the unloaded charge-pump 10, the pump output voltage VOUT can be calculated as:

$$VOUT = (L+1) \cdot \eta \cdot VREF,$$

wherein L is the number of activated stage circuits 11 to 14, η is the efficiency of a stage circuit and VREF is the value of the reference voltage.

In some applications the charge-pump output voltage VOUT is programmable. For applications with a supply voltage VDD>1.5 Volt the reference voltage VREF may be in the range of 1.1 Volt to 1.4 Volt. The lower limit is driven by the maximum threshold voltage of the CMOS switches and the maximum is limited by the supply voltage VDD. With these given constraints and assuming an efficiency η=0.83 the pump output voltage VOUT of a 42 stages charge-pump can be varied e.g. in the range VOUT=39.25 Volt to 50.0 Volt simply by choosing the value of the reference voltage VREF in the range VREF=1.1 Volt to 1.4 Volt. In case a larger programmable range is required (e.g. VOUT=30 Volt to 50 Volt) then the number N of charge-pump stages may be programmable.

Advantageously, the pump output voltage VOUT is a function of the reference voltage VREF and optionally also of the first reference voltage VREF1. Since these two voltages have only a small dependency on changes of the supply voltage VDD, noise and disturbances, the pump output voltage VOUT has a high stability.

A possible solution for the generation of the pump output voltage VOUT above the supply voltage VDD in a programmable manner is shown in FIG. 1A. For the sake of simplicity the first four stages only are shown, however the charge pump circuit 10 can be easily extended to any number of stages, and is independent how the single stages are realized. Such approach comprises a charge pump made of a plurality of stages connected in series, the first ones being programmable. Each programmable stage could be bypassed by a switch 41 used to transfer the reference voltage VREF to the first active stage. The switch 41 is realized by an NMOS high-voltage switch, controlled by the digital control signals SO1 to SO4 (that can be named stage_off_hv<4:1>).

Principle of operation (with respect to FIG. 1A): when all the stages 11 to 14 are active (stage_off_hv<4:1>=0) the pump output voltage equals VOUT=VREF1+4·VREF. When only the stage circuit 11 is bypassed (stage_off_hv<1>=1, stage_off_hv<4:2>=0) the NMOS switch 41 across stage 11 is on, then the second stage 12 receives the reference voltage VREF as input voltage IN, therefore VOUT=VREF1+3·VREF, and so forth. The pump output voltage VOUT is therefore programmable between VREF1 and VREF1+4·VREF.

In order to turn on the NMOS switches 41, 45 to 47 fully on, the gate control voltage SO1 to SO4 must be higher than VREF+VthNMOS (or VREF1+VthNMOS), wherein VthNMOS is a threshold voltage of the NMOS transistor 41, 45 to 47. The switches 41, 45 to 47 in FIG. 1A are normally realized by high-voltage NMOS devices. As the reference voltage VREF is derived from the on-chip bandgap reference, it ranges around 1 Volt. Therefore, the control signals SO1 to SO4 driving the gates of the high-voltage switches 41, 45 to 47 are level-shifted in order to ensure proper operation across the supply voltage variations. The charge pump circuit 10 may comprise an auxiliary supply that is realized as a voltage doubler circuit. Furthermore, the charge pump circuit 10 or each stage circuit 11 to 14 may comprise a level shifter coupling the control input 40 to the control terminal of the activation transistor 41 and being powered by the auxiliary supply. In applications where the reference voltage VREF is close to the minimum supply voltage VDD, the control signals SO1 to SO4 are generated by the voltage doubler circuit and/or the level shifter. Each programmable stage may comprises a level-shifter.

Figure 1B:
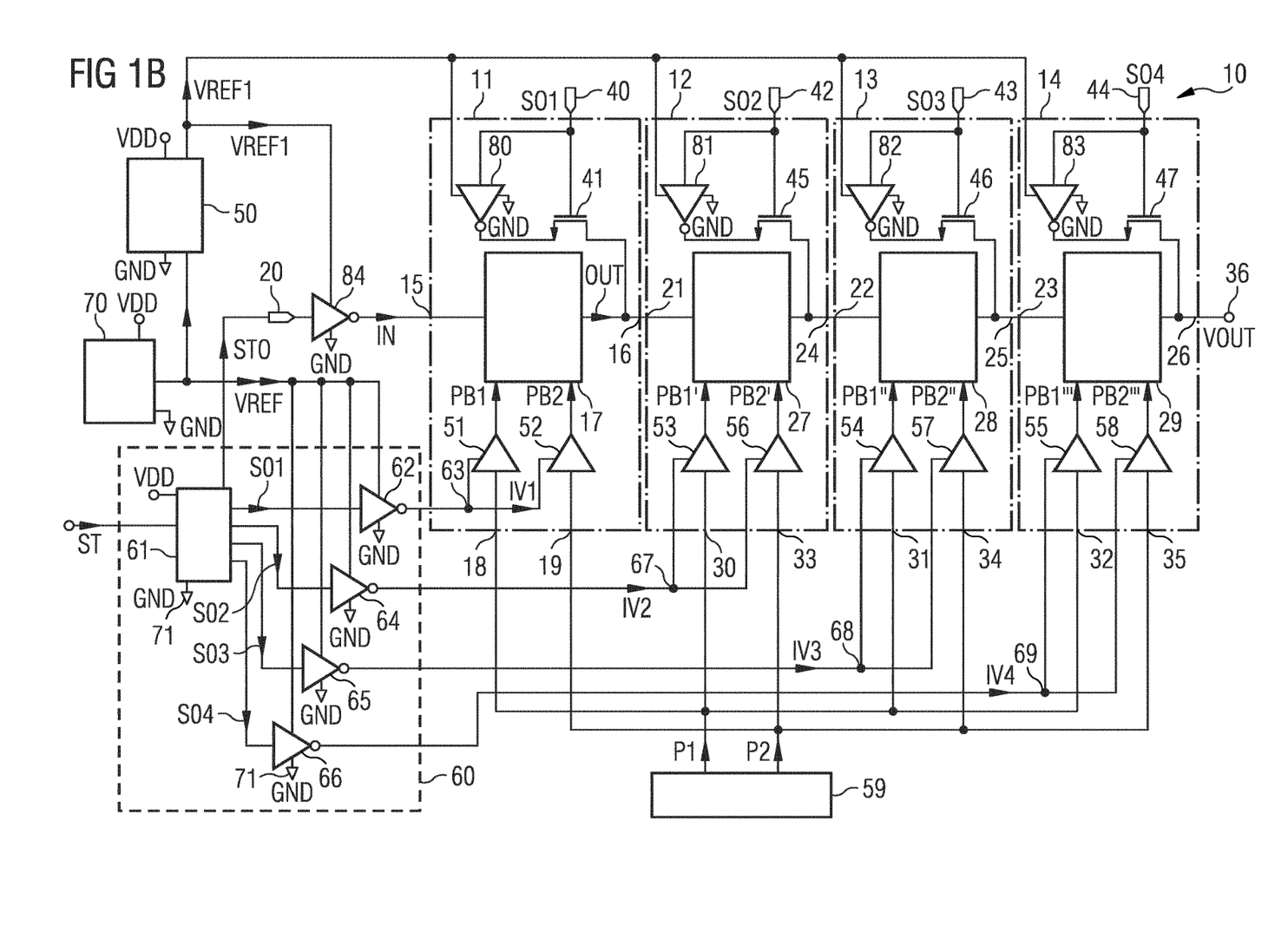
Figure 1C:
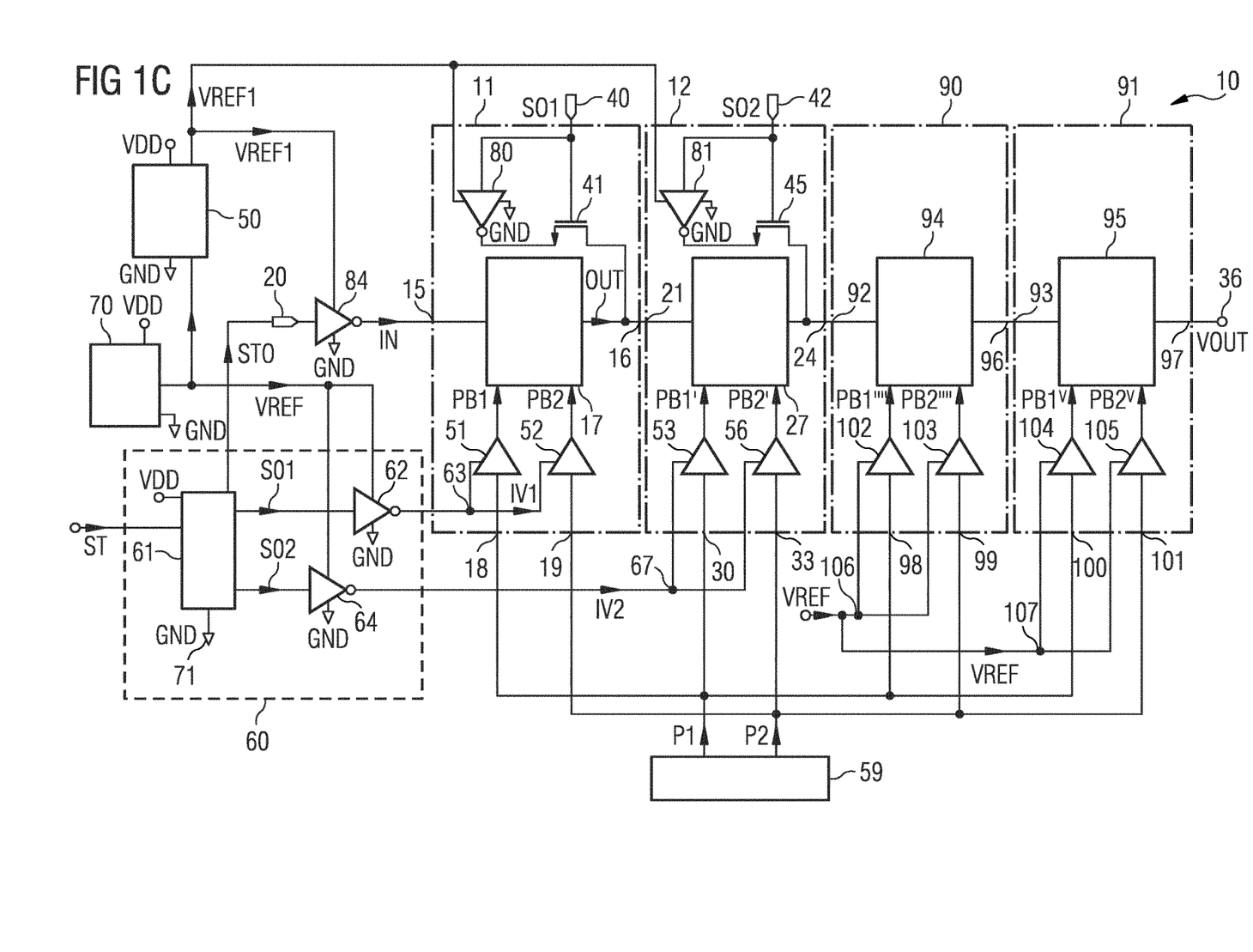

In an alternative embodiment, not shown, the stage output 26 of the last stage circuit 14 is coupled to the pump output 36 via a number M of permanent stage circuits, such as shown e.g. in FIG. 1C. The permanent stage circuits may be realized as the stage circuit 11 to 14 shown in FIG. 1A but are free of an activation transistor.

Figure 2A:
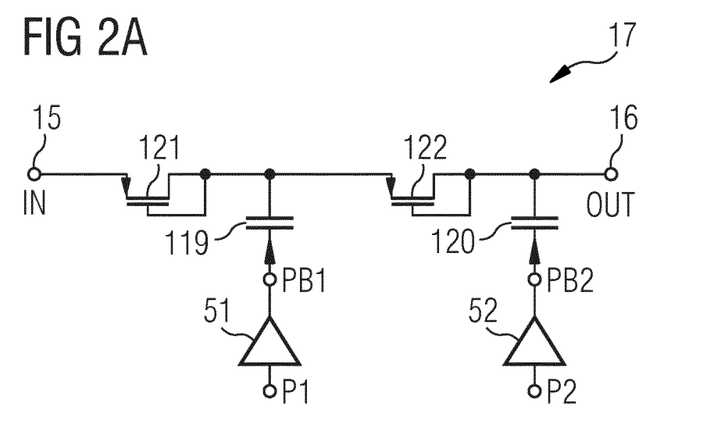
FIGS. 2A to 2D show examples of details of a charge pump circuit.
Figure 2B:
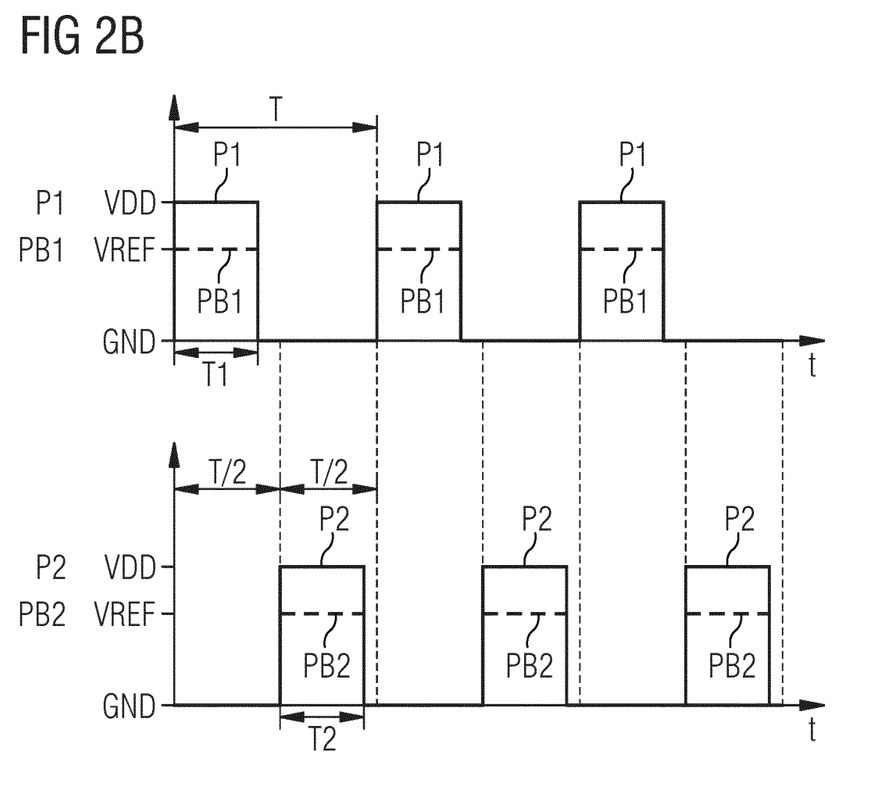
Figure 2C:
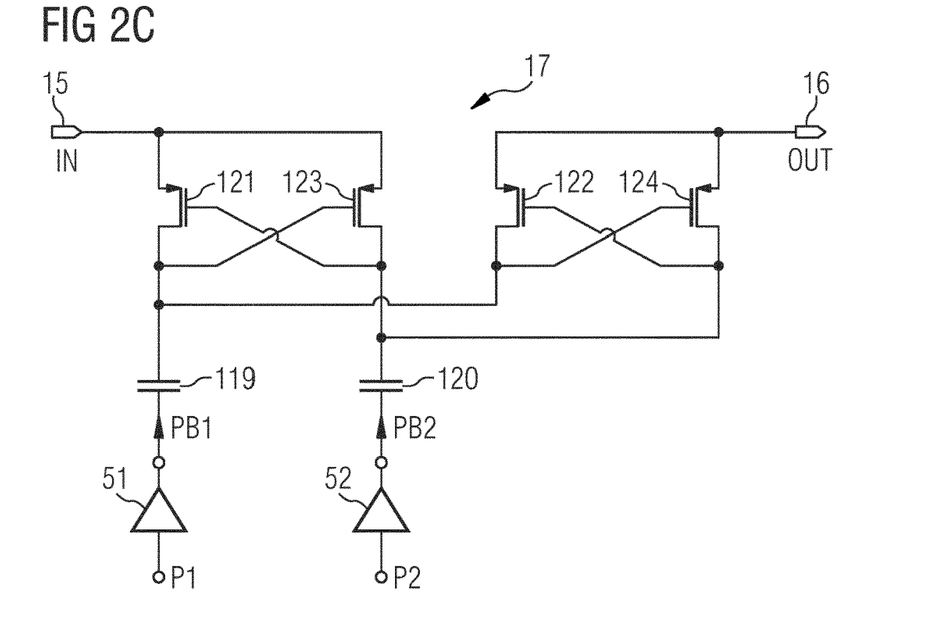

The operation of the converter circuit 17 is further illustrated by FIGS. 2A to 2C.

FIG. 1B shows a further example of an embodiment of the charge pump circuit 10 which is a further development of the embodiment shown in FIG. 1A. The charge pump circuit 10 is configured as a programmable charge-pump. The stage circuit 11 comprises a control buffer 80. The control buffer 80 may be realized as an inverter or inverting circuit. The control buffer 80 couples the control input 40 to a second terminal of the activation transistor 41. An input of the control buffer 80 is connected to the control input 40. An output of the control buffer 80 is connected to the second terminal of the activation transistor 41. A supply terminal of the control buffer 80 is coupled to the first voltage source 50. The first voltage source 50 may be connected to the output of the bandgap circuit 70. Moreover, the control buffer 80 is connected to the reference potential terminal 71.

Correspondingly, the second to the fourth stage circuit 12 to 14 comprise a second to a fourth control buffer 81 to 83 that are arranged such as the control buffer 80 of the stage circuit 11. Thus, the second to the fourth control buffer 81 to 83 couple the second to the fourth control input 42 to 44 to the second terminal of the second to the fourth activation transistor 45 to 47. The second to the fourth control buffer 81 to 83 may be realized as inverters or inverting circuits.

A further output of the control circuit 60 is coupled to the pump input 20. Thus, the decoder 61 is coupled to the pump input 20. The charge pump circuit 10 may comprise an input inverter 84 coupling the pump input 20 to the stage input 15 of the stage circuit 11.

The first reference voltage VREF1 is applied as a supply voltage to the input inverter 84. In the case that the converter circuit 17 is in a deactivated state, the input voltage IN provided to the stage input 15 is zero. Thus, the control circuit 60 generates a further control signal STO with a first logical value having a high voltage value that is converted by the input inverter 84 to the value zero in case the converter circuit 17 is deactivated. In the case that the converter circuit 17 is set in a deactivated state, the activation transistor 41 is set in a conducting state. In the case that the converter circuit 17 is in the deactivated state the control signal SO1 has a high value such as the supply voltage VDD, the reference voltage VREF or the first reference voltage VREF1; thus, the control buffer 80 generates an output signal that may obtain the reference potential GND. This output voltage of the control buffer 80 is provided to the stage output 16 via the activation transistor 41.

If the converter circuit 17 is activated, the control circuit 60 generates the further control signal STO with a second logical value having a low voltage value and thus generates the input voltage IN with the value of the first reference voltage VREF1. In the case that the converter circuit 17 is set in an activated state, the activation transistor 41 is set in a non-conducting state.

In the case that the control signal SO1 has a low value such as the ground potential GND, the control buffer 80 generates an output signal that may obtain the value of the first reference voltage VREF1. This output voltage of the control buffer 80 is provided to the second terminal of the activation transistor 41. Advantageously, the voltage at the second terminal of the activation transistor 41 is higher than the ground potential GND and thus a voltage difference between the first and the second terminal of the activation transistor 41 is limited resulting in a reduction of a leakage current through the activation transistor 41.

In FIG. 1B, a programmable charge-pump 10 is obtained as a plurality of stages 11 to 14 connected in series, the first ones being programmable. For the sake of simplicity the first four programmable stages 11 to 14 only are shown, however this circuit can be easily extended to any number of stages, and is independent how the single stages are realized. Programmability is obtained by the activation transistors 41, 45 to 47 realized as high-voltage NMOS switches. Contrary to the approach of FIG. 1A, the output of unused stages is shorted to the reference potential terminal 71 (named ground) instead of the first reference voltage VREF1 by the control buffer 80. The control buffer 80 is fabricated as inverting CMOS gate (e.g. inverter). This approach allows the activation switches 41, 45 to 47 to be driven without any level-shifting. No auxiliary supply (e.g. a voltage doubler) for the level shifters is needed.

Driving the source of the activation transistor 41 (e.g. realized as NMOS switch) with the inverted gate control signal reduces the leakage current through the activation transistor 41 when the activation transistor 41 is in a non-conducting state (off state). In the off state the gate voltage of the activation transistor 41 would be 0 Volt but the source voltage would be the first reference voltage VREF1 or the reference voltage VREF. Due to the negative gate-source voltage the leakage current through the activation transistor 41 is minimized. A low leakage current of the activation transistors 41, 45 to 47 is advantageous for a low temperature dependency of the pump output voltage VOUT.

Advantageously, the charge pump circuit 10 provides a simple on/off switching of charge pump stages 11 to 14 without level-shifted control signals SO1 to SO4. Leakage current through programming switches 41, 45 to 47 is minimized when in off-state. The charge pump circuit 10 is realized as a simpler circuit in comparison to other charge pumps and is area efficient. The charge pump 10 avoids level-shifting and auxiliary supply for the level-shifters in case the minimum supply voltage VDD is close to the reference voltage VREF.

For a finer adjustment of the charge-pump output voltage VOUT then in coarse steps of the reference voltage VREF, the reference voltage VREF can be adjusted in small steps, e.g. in steps of 10 mV. The reference voltage VREF may be out of the interval 1.0 Volt≤VREF≤1.5 Volt.

Advantageously, it is not necessary that each programmable stage 11 to 14 comprises a level-shifter, which may increase the area occupation and may complicate the routing of the control signals SO1 to SO4 if the number of programmable stages is significant. Also the auxiliary supply (e.g. voltage doubler) for the level-shifters is not needed. Compared to the circuit of FIG. 1A, the pump circuit 10 avoids any level-shifting stage and its supply to control the gates of the by-pass switches 41, 45 to 47, offering a more compact and simple solution to programmability.

FIG. 1C shows a further example of an embodiment of the charge pump circuit 10 which is a further development of the above-shown embodiments. The charge pump circuit 10 comprises the number N of stage circuits 11, 12 as is shown in FIG. 1A or 1B. Here, the number N is two. Additionally, the charge pump circuit 10 comprises a number M of permanent stage circuits 90, 91 which couple the stage output 24 of the last stage circuit 12 of the number N of stage circuits 11, 12 to the pump output 36. The number M may be 1, 2 ore more than 2.

The permanent stage circuits 90, 91 are free from an activation transistor. They are free from a control input. The permanent stage circuits 90, 91 do not receive a control signal. Similarly to the stage circuits 11 to 14, a permanent stage circuit 90 of the number M of permanent stage circuits 90, 91 comprise a stage input 92, a converter circuit 94, a stage output 96 coupled via the converter circuit 94 to the stage input 92 and a first and a second clock input 98, 99 coupled to the converter circuit 94. Additionally, the permanent stage circuit 90, 91 may comprise a first and a second clock buffer 102, 103. The permanent stage circuit 90 also receive a first and a second buffered clock signal PB1"", PB2"" which are provided by the further first and second clock buffer 102, 103 to the converter circuit 94.

The additional permanent stage circuit 91 or circuits of the number M of permanent stage circuits 90, 91 are realized such as the permanent stage circuit 90. Thus, the additional permanent stage circuit 91 has a converter circuit 95, a stage output 97, a stage input 93 coupled via the converter circuit 95 to the stage output 97, a first and a second clock input 100, 101 and optionally also a first and a second clock buffer 104, 105.

Thus, the charge pump circuit 10 comprises at least one stage circuit 11 and at least one permanent stage circuit 90.

As shown in FIGS. 1A to 1C, the first and the second clock buffer 51, 52 have an input to receive the first or the second clock signal P1, P2, are connected to the buffer control terminal 63 for receiving the buffer control signal IV1 and to the reference potential terminal 71 for receiving the reference potential GND. As shown in FIGS. 1B and 1C, the buffer control signal IV1 may also provide the power supply of the first and the second clock buffer 51, 52. The first and the second clock buffer 51, 52 may be realized as inverters (e.g. an inverter consisting of a PMOS FET and a NMOS FET) or as inverting circuits. The further clock buffers 53 to 58 are realized such as the first and the second clock buffer 51, 52.

Alternatively, the clock buffers 51 to 58 shown in FIGS. 1B and 1C may be realized such as the clock buffers 51 to 58 shown in FIG. 1A.

FIG. 2A shows an example of an embodiment of a converter circuit 17. The converter circuit 17 can be used for the stage circuit 11 but also for any of the number N of stage circuits 11 to 14 or the number M of permanent stage circuits 90, 91. The stage circuit 17 comprises a first and a second capacitor 119, 120 and a first and a second transistor 121, 122. The first clock input 18 is coupled to a first electrode of the first capacitor 119. Correspondingly, the second clock input 19 is coupled to a first electrode of the second capacitor 120. Optionally, the first clock input 18 is coupled via the first clock buffer 51 to the first electrode of the first capacitor 119 and the second clock input 19 is coupled via the second clock buffer 52 to the first electrode of the second capacitor 120.

The stage input 15 is coupled via the first transistor 121 to a second electrode of the first capacitor 119. The second electrode of the first capacitor 119 is coupled via the second transistor 122 to the stage output 16 of the converter circuit 17. The second electrode of the second capacitor 120 is coupled or connected to output 16. The first and the second transistor 121, 122 are arranged as diode circuits. The first and the second transistor 121, 122 are implemented as field-effect transistors. The first and the second transistor 121, 122 are realized as metal-oxide-semiconductor field-effect transistors. The first and the second transistor 121, 122 are fabricated as p-channel metal oxide semiconductor field-effect transistors, abbreviated PMOS FET.

A control terminal of the first transistor 121 is connected to a first terminal of the first transistor 121. The control terminal of the first transistor 121 is connected to the second electrode of the first capacitor 119. The control terminal of the second transistor 122 is connected to a first terminal of the second transistor 122. The control terminal of the second transistor 122 is connected to the second electrode of the second capacitor 120. An area efficient variant of the converter circuit 17 in the stage circuit 11 is shown in FIG. 2A. The converter circuit 17 is realized as a simple Dickson charge-pump stage with diode connected PMOS transistors 121, 122. The operation of the voltage converter 17 is explained below.

FIG. 2B shows an example of an embodiment of the first and the second clock signal P1, P2 and of the first and the second buffered clock signal PB1, PB2. In FIG. 2B, the clock signals P1, P2, PB1, PB2 are shown as a function of a time t. The first clock signal P1 and the first buffered clock signal PB1 are periodically repeated with a period duration T. Also the second clock signal P2 and the second buffered clock signal PB2 are periodically repeated with the same period duration T. A pulse of the first clock signal P1 and of the first buffered clock signal PB1 have a first duration T1. A pulse of the second clock signal P2 and of the second buffered clock signal PB2 have a second duration T2. The period duration T may be the sum of the first duration and the second duration: T=T1+T2

Alternatively, the period duration T is larger than the sum of the first and the second duration T1, T2: T>T1+T2

Thus, there is a non-overlap time between a pulse of the first clock signal P1 and the following pulse of the second clock signal P2 and also a non-overlap time between a pulse of the second clock signal P2 and the following pulse of the first clock signal P1. The first and the second clock signal P1, P2 may be digital signals, wherein a pulse may correspond to a first logical value and the time between two pulses may correspond to a second logical value. The first logical value may be the logical value 1 and corresponds to the value of a supply voltage VDD. The second logical may correspond to a logical value 0 and may be realized by the reference potential GND.

The buffered first clock signal PB1 and the buffered second clock signal PB2 have the same form as the first and the second clock signal P1, P2, whereas the height of the first and the second buffered clock signal PB1, PB2 toggles between the value of the reference voltage VREF and the value of the ground potential GND.

Since the first and the second transistor 121, 122 shown in FIG. 2A are connected as diodes, the first and the second capacitor 119, 120 are charged before the start of operation with the input voltage IN provided at the stage input 15, for example with the reference voltage VREF or the first reference voltage VREF1. Thus, the first capacitor 119 is charged up to the input voltage IN minus a threshold voltage of the first transistor 121 and the second capacitor 120 is charged up to the value of the input voltage IN minus the threshold voltage of the first transistor 121 and minus the threshold voltage of the second transistor 122.

By a pulse of the first clock signal P1, charge at the second electrode of the first capacitor 119 flows through the second transistor 122 to the second electrode of the second capacitor 120 and optionally to the stage output 16. At a pulse of the second clock signal P2, charge at the second electrode of the second capacitor 120 flows through the output 16 and via a first transistor of the following converter circuit 27 (which is e.g. the second converter stage 27) to a first capacitor of the following converter circuit 27. The circuit in FIG. 2A may be named a two pump stage (single phase). The output voltage OUT is tripled relative to the input voltage IN and not only doubled as shown in FIG. 2C. Thus, some of the equations mentioned above may not be valid for the circuit of FIG. 2A.

FIG. 2C shows a further example of an embodiment of the converter circuit 17 that is a further development of the example shown in FIG. 2A and also uses the signals P1, P2, PB1, PB2 shown in FIG. 2B. The converter circuit 17 can be used for the stage circuit 11 but also for any of the number N of stage circuits 11 to 14 or the number M of permanent stage circuits 90, 91. Additionally, the converter circuit 17 comprises a third and a fourth transistor 123, 124. The converter circuit 17 uses two NMOS transistors 121, 123 and two PMOS transistors 122, 124 arranged in kind of latch. For driving the latch two capacitors 119, 120 are used.

The third transistor 123 couples the stage input 15 to the second electrode of the second capacitor 120. The fourth transistor 124 couples the second electrode of the second capacitor 120 to the stage output 16. The first to the fourth transistor 121, 122, 123, 124 are realized as field-effect transistors. The first to the fourth transistors 121, 122, 123, 124 are realized as metal-oxide-semiconductor field-effect transistors. The first and the third transistor 121, 123 are realized as n-channel metal-oxide-semiconductor field-effect transistors, abbreviated NMOS transistors. The second and the fourth transistor 124 are realized as p-channel metal-oxide-semiconductor field-effect transistors, abbreviated PMOS transistors.

A control terminal of the first transistor 121 is connected to the second electrode of the second capacitor 120. A control terminal of the third transistor 123 is connected to the second electrode of the first capacitor 119. A control terminal of the second transistor 122 is connected to the second electrode of the second capacitor 120. A control terminal of the fourth transistor 124 is connected to the second electrode of the first capacitor 119.

Thus, the first and the third transistor 121, 123 are cross-coupled, wherein the first terminals of the first and the third transistor 121, 123 are connected to the stage input 15 and the second terminals of the first and the third transistor 121, 123 are connected to the second electrode of the first capacitor 119 and to the second electrode of the second capacitor 120. Also the second and the fourth transistor 122, 124 are cross-coupled. The first terminals of the third and the fourth transistor 122, 124 are connected to the stage output 16 and the second terminals of the second and the fourth transistor 122, 124 are connected to the second electrode of the first capacitor 119 and to the second electrode of the second capacitor 120.

In the case of a pulse of the first clock signal P1 or the first buffered clock signal PB1, the third transistor 123 is set in a conducting state such that charge can flow from the stage input 15 to the second capacitor 120. Simultaneously, this pulse sets the fourth transistor 124 in a non-conducting state, the first transistor 121 in a non-conducting state and the second transistor 122 in a conducting state such that charge from the first capacitor 119 can flow through the stage output 16 to the next converter circuit such as the second converter circuit 27.

A pulse of the second clock signal P2 or of the second buffered clock signal PB2 results in setting the first transistor 121 in a conducting state such that the charge can flow from the stage input 15 to the first capacitor 119 and in setting the second transistor 122 in a non-conducting state. Moreover, this pulse of the second clock signal P2 or of the second buffered clock signal PB2 sets the third transistor 123 in a non-conducting state and the fourth transistor 124 in a conducting state such that charge can flow from the second capacitor 120 through the stage output 16 to the next converter circuit 27. The converter circuits 17 shown in FIGS. 2A and 2C are only examples for possible converter circuits inserted in the charge pump circuit 10 shown in FIGS. 1A, 1B and 1C.

Figure 2D:
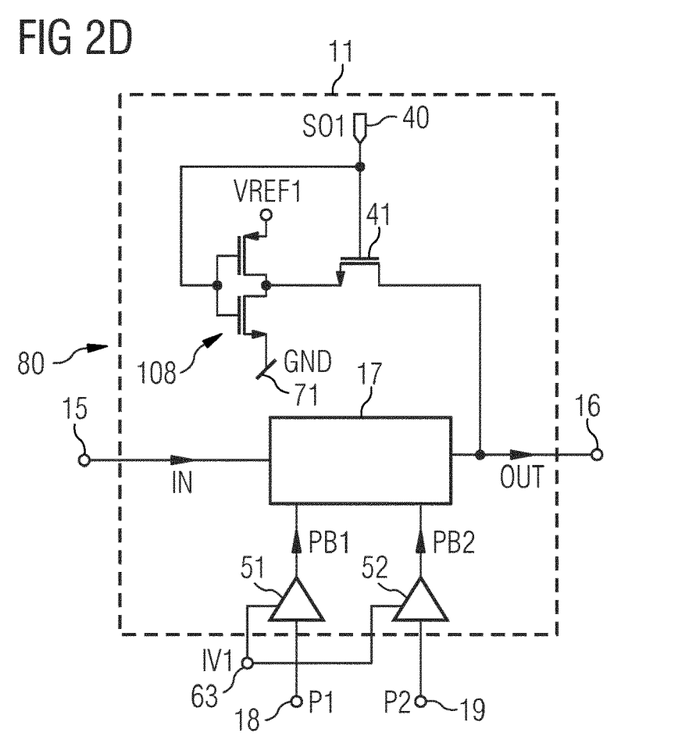

FIG. 2D shows a further example of the stage circuit 11 that is a further development of the examples shown above. In FIG. 2D, the control buffer 80 is realized as a control inverter 108. The control inverter 108 drives the source of the activation transistor 41, realized as the NMOS switch. The control inverter 108 is supplied by the first reference voltage VREF1 or the reference voltage VREF like the clock buffers 51, 52 receiving the clock signal P1, P2 and driving the buffered clock signals PB1, PB2. Basically, the supply of the control inverter 108 (connection to the source of the PMOS switch) does not necessarily need to be the reference voltage VREF or VREF1. It can be any voltage larger than 0 Volt (such that the control inverter 108 operates properly) in order to have a negative gate-source voltage VGS on the NMOS switch 41 in case the stage circuit 11 is activated (stage_off<n>=0V). The leakage current of the NMOS switch 41 in off-state decreases the larger the negative gate-source voltage VGS. The control inverter 108 may comprise or consist of a NMOS FET and a PMOS FET.

In general, the term "coupled" may be replaced by "connected" or "directly and permanently connected". The term "connected" may be replaced by "coupled" or "directly and permanently connected".

The invention claimed is:

1. A charge pump circuit, comprising:
a series circuit of a number N of stage circuits,
wherein at least one of the stage circuit comprises,
a converter circuit,
a stage output,
a stage input coupled via the converter circuit to the stage output,
a first clock input and a second clock input coupled to the converter circuit,
a control input,
an activation transistor having a control terminal coupled to the control input and a first terminal coupled to the stage output,
a control buffer having an input coupled to the control input and an output coupled to a second terminal of the activation transistor, and
a reference potential terminal for receiving a reference potential,
wherein in the case that the converter circuit is set in a deactivated state, the activation transistor is set into a conducting state and the control buffer generates an output signal that obtains the reference potential and that is provided to the state output via the activation transistor, and
wherein in the case that the converter circuit is set in an activated state, the activation transistor is set into a non-conducting state.

2. The charge pump circuit according to claim 1, wherein the control buffer is realized as a control inverter.

3. The charge pump circuit according to claim 1, wherein the control buffer is connected to a first voltage source for receiving a first reference voltage and to the reference potential terminal.

4. The charge pump circuit according to claim 3, wherein in the case that the converter circuit is set into the activated state, the control buffer generates its output signal by obtaining the first reference voltage, such that the first reference voltage is provided to the second terminal of the activation transistor.

5. The charge pump circuit according to claim 1, wherein the stage circuit comprises a first clock buffer and a second clock buffer, and
wherein the first clock buffer couples the first clock input to the converter circuit and the second clock buffer couples the second clock input to the converter circuit.

6. The charge pump circuit according to claim 5, wherein the first and the second clock buffer are connected to the reference potential terminal and comprise a buffer control terminal for receiving a buffer control signal.

7. The charge pump circuit according to claim 6, wherein the buffer control signal has a value of a reference voltage in case the stage circuit is activated and a ground potential in case the stage circuit is deactivated.

8. The charge pump circuit according to claim 7, wherein the charge pump circuit comprises a bandgap circuit providing the reference voltage.

9. The charge pump circuit according to claim 1, wherein the charge pump circuit comprises a control circuit that is configured to provide a control signal to the control input of the stage circuit with a first value in case the stage circuit is activated and a second value in case the stage circuit is deactivated.

10. The charge pump circuit according to claim 9, wherein the control circuit is configured to provide the buffer control signal to the buffer control terminal.

11. The charge pump circuit according to claim 1, wherein the converter circuit comprises a first and a second capacitor and a first and a second transistor, wherein the first clock input is coupled to a first electrode of the first capacitor, the stage input is coupled via the first transistor to a second electrode of the first capacitor, the second electrode of the first capacitor is coupled via the second transistor to the stage output, the second clock input is coupled to a first electrode of the second capacitor and a second electrode of the second capacitor is coupled to the stage output.

12. The charge pump circuit according to claim 11, wherein the converter circuit comprises a third and a fourth transistor, wherein the stage input is coupled via the third transistor to the second electrode of the second capacitor and the second electrode of the second capacitor is coupled via the fourth transistor to the stage output.

13. The charge pump circuit according to claim 1, wherein the charge pump circuit comprises a number M of permanent stage circuits which couple the stage output of a last stage circuit of the number N of stage circuits to a pump output of the charge pump circuit, wherein a permanent stage circuit comprises:
   a converter circuit,
   a stage output,
   a stage input coupled via the converter circuit to the stage output,
   a first clock input and a second clock input coupled to the converter circuit, and
wherein the permanent stage circuit is free of an activation transistor.

14. A method for voltage conversion, comprising:
   setting at least one stage circuit of a series of a number N of stage circuits in an activated state by providing a control signal to a control terminal of an activation transistor with a first value, wherein the at least one stage circuit comprises:
   a converter circuit,
   a stage output,
   a stage input coupled via the converter circuit to the stage output,
   a first clock input and a second clock input coupled to the converter circuit,
   a control input, and
   the activation transistor with the control terminal being coupled to the control input and with a first terminal coupled to the stage output, and
   a control buffer having an input coupled to the control input for receiving the control signal and an output coupled to a second terminal of the activation transistor, wherein in the case that the converter circuit is set in an activated state, the activation transistor is set into a non-conducting state, and
   wherein in the case that converter circuit is set in a deactivated state, the activation transistor is set into a conducting state and the control buffer generates an output signal that obtains a reference potential and that is provided to the stage output via the activation transistor.

15. The method according to claim 14, wherein a pump output voltage is generated at a pump output that is coupled to the stage output of a last stage circuit of the series of the number N of stage circuits and wherein the pump output voltage is a programmable voltage higher than a supply voltage.

16. The method according to claim 14, wherein in the case that the converter circuit is set into the activated state, the control buffer generates its output signal by obtaining a first reference voltage from a first voltage source, such that the first reference voltage is provided to the second terminal of the activation transistor.

* * * * *